(12) United States Patent
Wang (10) Patent No.: US 7,663,429 B2
(45) Date of Patent: Feb. 16, 2010

(54) DRIVER AMPLIFIER CIRCUIT HAVING REDUCED DC BIAS

(75) Inventor: Tze-Chien Wang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 27 days.

(21) Appl. No.: 12/031,522

(22) Filed: Feb. 14, 2008

(65) Prior Publication Data

US 2008/0197907 A1 Aug. 21, 2008

(30) Foreign Application Priority Data

Feb. 16, 2007 (TW) .............................. 96106039 A (51) Int. Cl.
*G05F 1/10* (2006.01)
(52) U.S. Cl. ...................... 327/536; 327/540; 330/296; 330/297
(58) Field of Classification Search ................. 327/536, 327/540; 330/296, 297
See application file for complete search history.

(56) References Cited

U.S. PATENT DOCUMENTS

| | | | | |
|---|---|---|---|---|
| 5,289,137 A | * | 2/1994 | Nodar et al. ................. | 330/296 |
| 5,834,977 A | * | 11/1998 | Maehara et al. ............. | 330/297 |
| 6,326,844 B1 | * | 12/2001 | Morris et al. ............... | 330/149 |
| 7,061,327 B2 | | 6/2006 | Doy | |
| 7,061,328 B2 | * | 6/2006 | Doy ........................... | 330/297 |
| 7,382,195 B2 | * | 6/2008 | Chen et al. .................. | 330/297 |

FOREIGN PATENT DOCUMENTS

JP 2005-86611 * 3/2005

* cited by examiner

*Primary Examiner*—Kenneth B. Wells
(74) *Attorney, Agent, or Firm*—Thomas, Kayden, Horstemeyer & Risley (57) ABSTRACT

A driver amplifier circuit is provided which includes a voltage level shifting circuit and an Op-Amp. A positive power supply terminal and a negative power supply terminal of the Op-Amp receive a first reference voltage and a second reference voltage outputted from the voltage level shifting circuit, causing a DC voltage level of an output signal to be equal to 0V. Meanwhile, the absolute value of a voltage difference between the first reference voltage and the second reference voltage is equal to $V_{DD}$, meaning that elements in the circuit operate without risking a high-voltage damage.

20 Claims, 7 Drawing Sheets

DRIVER AMPLIFIER CIRCUIT HAVING REDUCED DC BIAS

CROSS REFERENCE TO RELATED APPLICATION

This application claims priority of Application No. 096106039 filed in Taiwan, R.O.C. on Feb. 16, 2007 under 35 U.S.C. §119; the entire contents of which are hereby incorporated by reference.

BACKGROUND OF THE INVENTION

1. Field of the Invention

The invention relates to electronic circuits, and more particularly, to a driver amplifier circuit.

2. Description of the Related Art

In a process that a signal is transmitted from a first unit to a second unit, if these two units have different DC voltage levels, a DC component is usually removed from the signal by means of AC-coupling (e.g., using a capacitor) before the signal enters the second unit. Then, the DC voltage level of the signal is reconstructed in the second unit.

Figure 1:
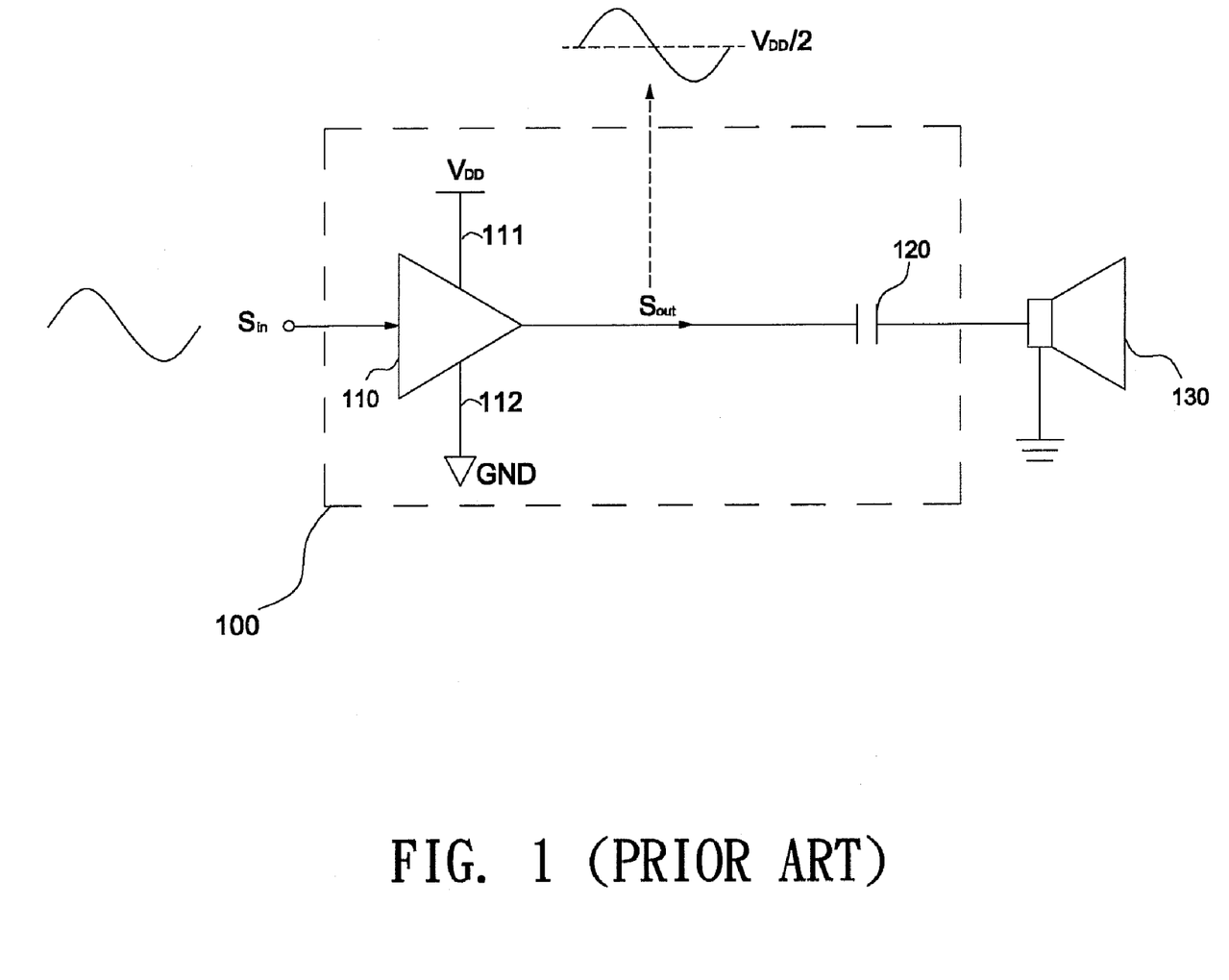
FIG. 1 is a block diagram of a conventional earphone driver amplifier circuit.

FIG. 1 is a block diagram of a conventional earphone driver amplifier circuit. Assuming that an operational amplifier (Op-Amp) in FIG. 1 is supplied with 5V, then $V_{DD}$=5V. The supply voltage $V_{DD}$ and a ground voltage are respectively supplied to a positive power supply terminal 111 and a negative power supply terminal 112 of an Op-Amp 110. The output signal $S_{out}$ of the Op-Amp 110 contains a DC component equal to $V_{DD}/2$. An output terminal of the Op-Amp 110 is connected in series with an AC-coupling capacitor 120 so as to remove the DC component contained in the audio signal $S_{out}$ for reducing power consumption and avoiding damaging the speaker 130. In addition, it is necessary for low-frequency audio signals to pass through the capacitor 120 and the speaker 130 has a relatively low impedance, so the capacitor 120 has a capacitance within the range of several hundreds of microfarads. However, the capacitors in the several hundreds of microfarads have a higher hardware cost in addition to having a larger size and taking up more space.

U.S. Pat. No. 7,061,327 discloses another conventional method, causing an output audio signal to be biased at the ground voltage (i.e., the DC component equal to 0V) by providing a negative voltage ($-V_{DD}$). Even though such design saves the trouble of configuring the AC-coupling capacitor 120, the voltage that the elements in the driver amplifier circuit may sustain is increased from $V_{DD}$ to ($2 \times V_{DD}$) (meaning that the sizes of the elements need to be increased so as to increase the withstand voltages of the elements), otherwise the elements in the driver amplifier circuit will be damaged. Thus, there is a need to improve the prior art earphone driver amplifier circuits.

SUMMARY OF THE INVENTION

In view of the above-mentioned problems, an object of the present invention is to provide a driver amplifier circuit for solving the above-mentioned problems.

Another object of the present invention is to provide a voltage generator of a driver amplifier circuit for supplying an operating voltage so as to provide a voltage difference of which is what the driver amplifier circuit needs.

Another object of the present invention is to provide a driver amplifier circuit for supplying an operating voltage so as to eliminate the DC offset of an output signal.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The driver amplifier circuit of the present invention will be described with reference to the accompanying drawings.

Figure 2:
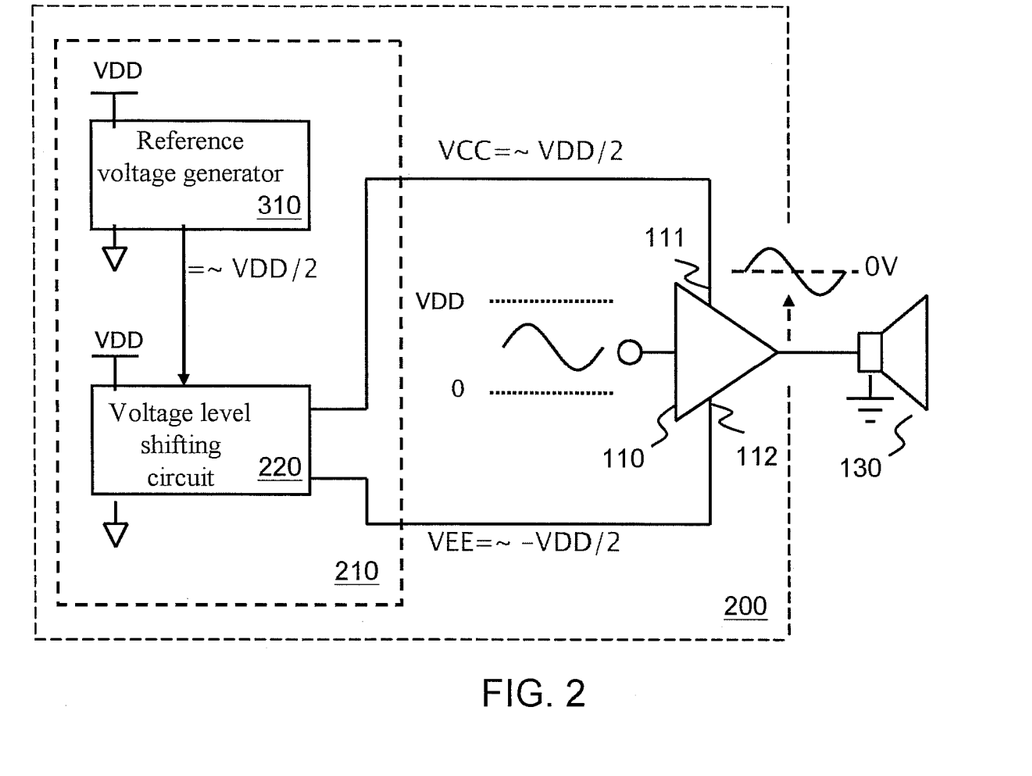
FIG. 2 is a block diagram of a driver amplifier circuit according to an embodiment of the present invention.

FIG. 2 is a block diagram of a driver amplifier circuit according to an embodiment of the present invention. A driver amplifier circuit 200 of the present invention includes an Op-Amp 110 and a voltage generator 210. The voltage generator 210 receives a pair of first operating voltages ($V_{DD}$ and GND) and then generates a pair of second operating voltages (such as $V_{DD}/2$ and $-V_{DD}/2$). The Op-Amp 110 receives the pair of second operating voltages $V_{DD}/2$ and $-V_{DD}/2$) and outputs an output signal in accordance with an input signal to a speaker 130. Since the DC voltage level of the output signal is zero (i.e., GND or no DC bias contained), there is no need for the circuit to configure an AC-coupling capacitor. In an embodiment, since a withstand voltage that the elements in the driver amplifier circuit 200 sustain corresponds to a voltage difference between the pair of second operating voltages, the elements in the driver amplifier circuit 200 are designed to sustain a withstand voltage of $V_{DD}$ instead of a withstand voltage of ($2 \times V_{DD}$) if the voltage difference between the pair of second operating voltages is equal to $V_{DD}$. As such, it saves the trouble of installing the AC-coupling capacitor.

According to one embodiment of the present invention, the voltage generator 210 includes a voltage level shifting circuit 220 for performing a half of voltage value ($V_{DD}/2$) shifting over the pair of first operating voltages ($V_{DD}$ and GND) and then outputting the pair of second operating voltage ($V_{DD}/2$ and $-V_{DD}/2$). In a preferred embodiment, the half of the voltage value ($V_{DD}/2$) is provided by a reference voltage generator 310, e.g., a voltage regulator.

The voltage level shifting circuit 220 is implemented with a charge pump. It should be understood, however, that the present invention is not limited to the particular voltage level shifting circuits described above, but fully extensible to any existing or yet-to-be developed DC to DC voltage converters.

Hereinafter, the voltage level shifting circuit will be described in detail in accordance with FIGS. 3A and 3B.

Figure 3A:
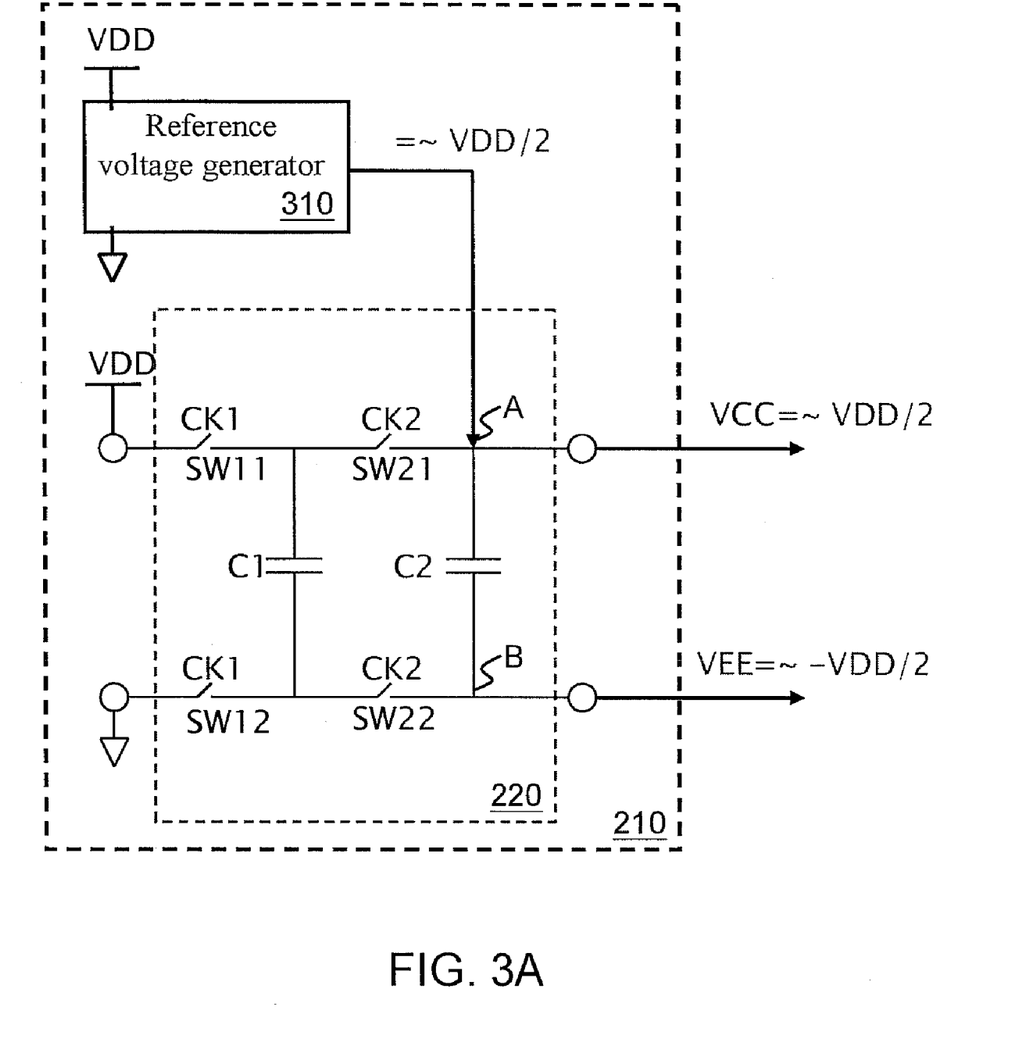
FIG. 3A is a block diagram of a voltage level shifting circuit according to one embodiment of the present invention.
Figure 3B:
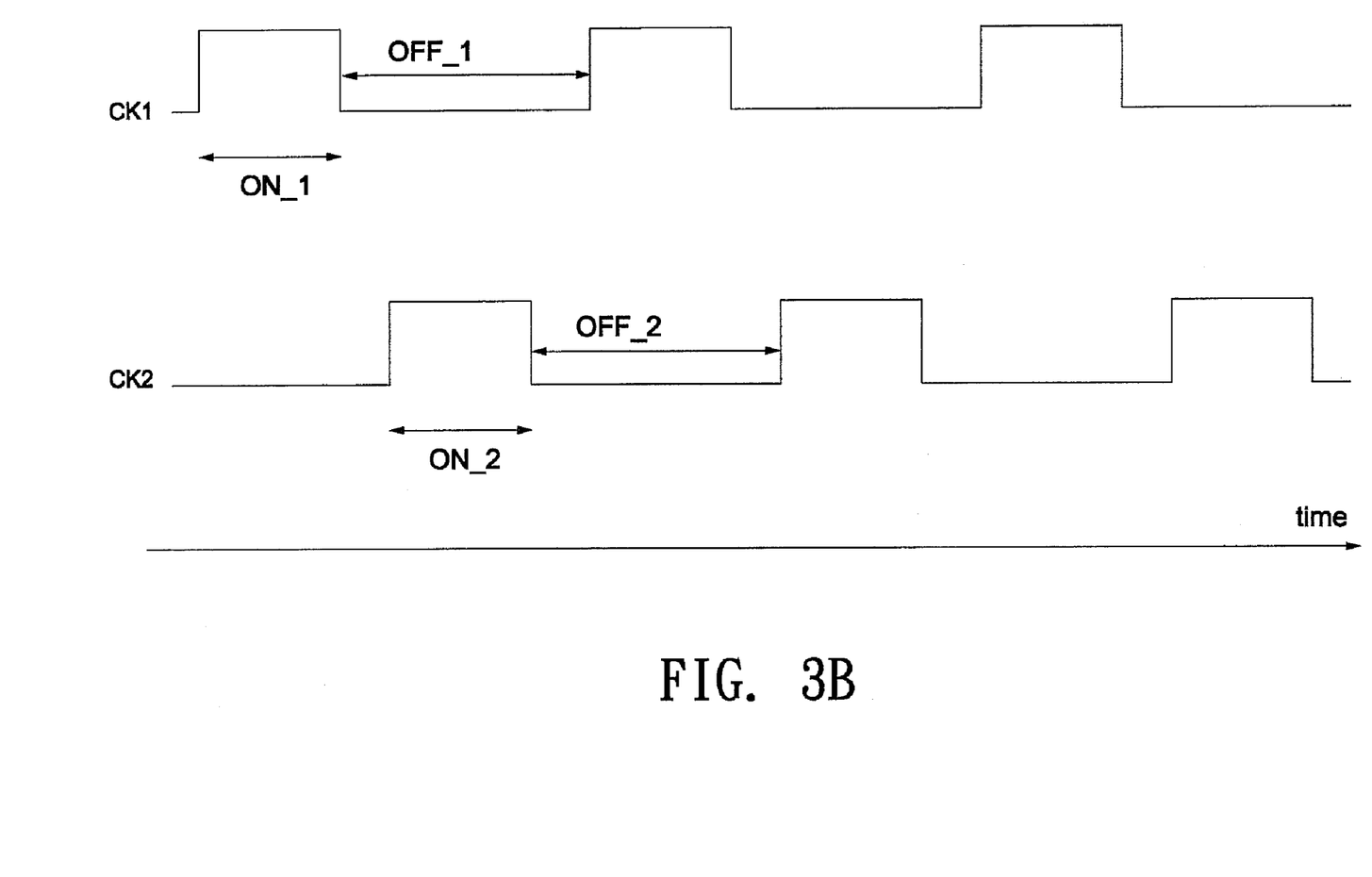
FIG. 3B is a timing diagram illustrating relations between turn-off periods and turn-on periods of switches SW11, SW12 and switches SW21, SW22.

FIG. 3A is a block diagram of a voltage level shifting circuit according to one embodiment of the present invention. FIG. 3B is a timing diagram illustrating relations between turn-off periods and turn-on periods of switches SW11, SW12 and switches SW21, SW22.

Referring to FIG. 3A, the voltage level shifting circuit 220 includes a first pair of switches SW11, SW12, a second pair of switches SW21, SW22 and a pair of capacitors C1, C2. As observed from the left hand side of FIG. 3A, the voltage level shifting circuit 220 simultaneously receives the supply voltage $V_{DD}$ and the ground voltage GND, so the relative voltage across the voltage level shifting circuit 220 is $V_{DD}$, with two floatable absolute voltage values. In order to set these two absolute voltage values of the voltage level shifting circuit 220, a voltage regulator 310 is used to couple with either of two output terminals of the voltage level shifting circuit 220. For example, if a low-voltage output terminal B is coupled with a voltage of $V_{DD}$, then a high-voltage output terminal A will generate a voltage of ($2 \times V_{DD}$).

FIG. 3A is an exemplary diagram of a voltage regulator 310 that generates a voltage of ($V_{DD}/2$) and is first coupled to the high-voltage output terminal A. During initialization, before coupled to the supply voltage, capacitors C1, C2 are in neutral status; it is neither positive nor negative. Referring also to FIG. 3B, the switches SW11, SW12 are controlled by a signal CK1 while the switches SW21, SW22 are controlled by a signal CK2. In an embodiment, the signal CK2 is generated by an oscillating signal generator and the signal CK1 is generated by a non-overlap clock generator according to the signal CK2. The oscillating signal generator and the non-overlap clock generator are well known to those skilled in the art and thus will not be described herein. While the switches SW11, SW12 are closed (turned ON) and the switches SW21, SW22 are opened (turned OFF), the capacitor C1 starts to charge and a potential difference of $V_{DD}$ finally develops across two plates of the capacitor C1. Next, while the switches SW11, SW12 are opened (turned OFF) and the switches SW21, SW22 are closed (turned ON), half of charge in the capacitor C1 will be transferred to the capacitor C2 and voltages of the capacitors C1, C2 are reduced to one-half (according to a charge conservation law and a formula Q=C× V) if two capacitors C1, C2 have equivalent capacity. As such, it is thus obvious that the process, which the capacitor C1 is charged to a voltage of $V_{DD}$ and then shares its charge with the capacitor C2, continues for a few cycles until the voltage of $V_{DD}$ is developed across the capacitors C1, C2. At this moment, since the high-voltage output terminal A has been already coupled to a positive reference voltage of $V_{DD}/2$ and the voltage across the capacitor C2 is equal to $V_{DD}$, the low-voltage output terminal B will generate a negative reference voltage of ($-V_{DD}/2$) for the Op-amp 110. In addition, in this embodiment, the positive reference voltage of $V_{DD}/2$ is generated by a reference voltage generator 310 according to the supply voltage $V_{DD}$. The implementation of the reference voltage generator 310 is well known to those skilled in the art and thus will not be described herein.

In practice, diodes can be substituted for the switches SW11, SW12, SW21, SW22, but voltage drops across the diodes need to be taken into consideration.

If the circuit of the present invention is used to process audio signals, the capacitors C1, C2 have capacitances within the range of several microfarads (such as 2.2 µF) since frequencies of input audio signals $S_{in}$ range from 20 Hz to 20 KHz. The switching frequencies of the switches SW11, SW12, SW21, SW22 are in the range of several hundreds of KHz (e.g., 320 KHz). In one embodiment, the turn-on periods ON_1 of the switches SW11, SW12 do not overlap the turn-on periods ON_2 of the switches SW21, SW22.

Figure 4A:
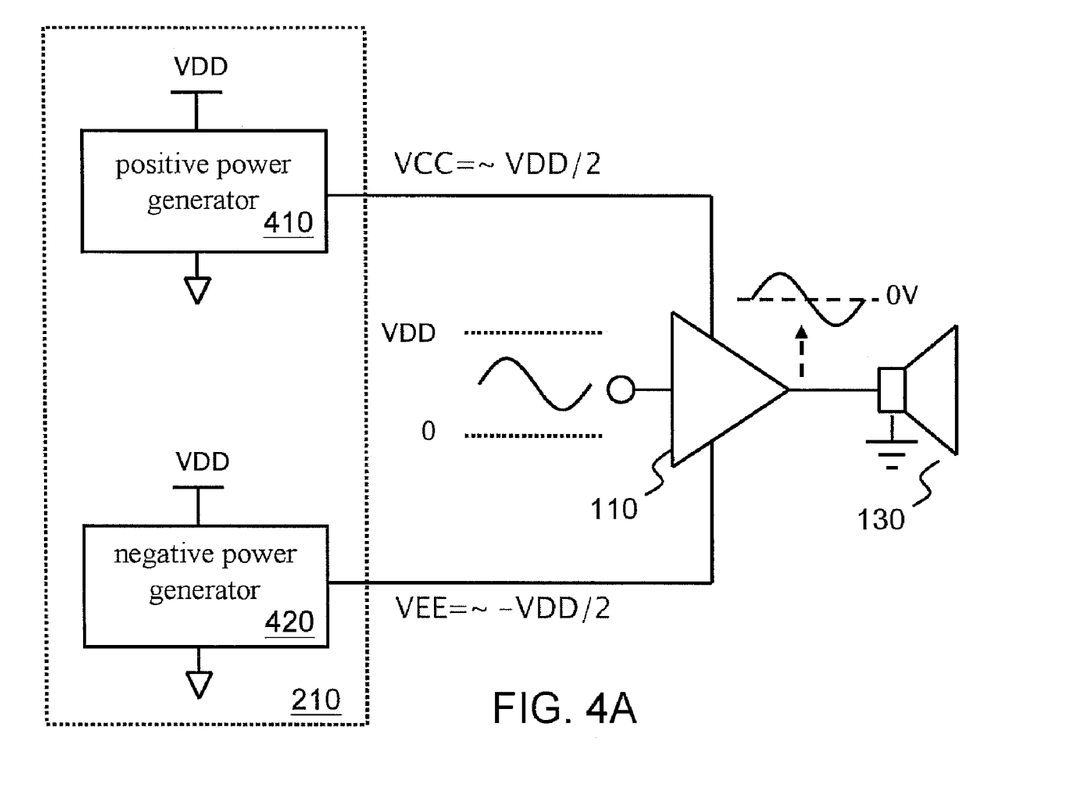
FIG. 4A is a block diagram of a voltage generator according to another embodiment of the present invention.
Figure 4B:
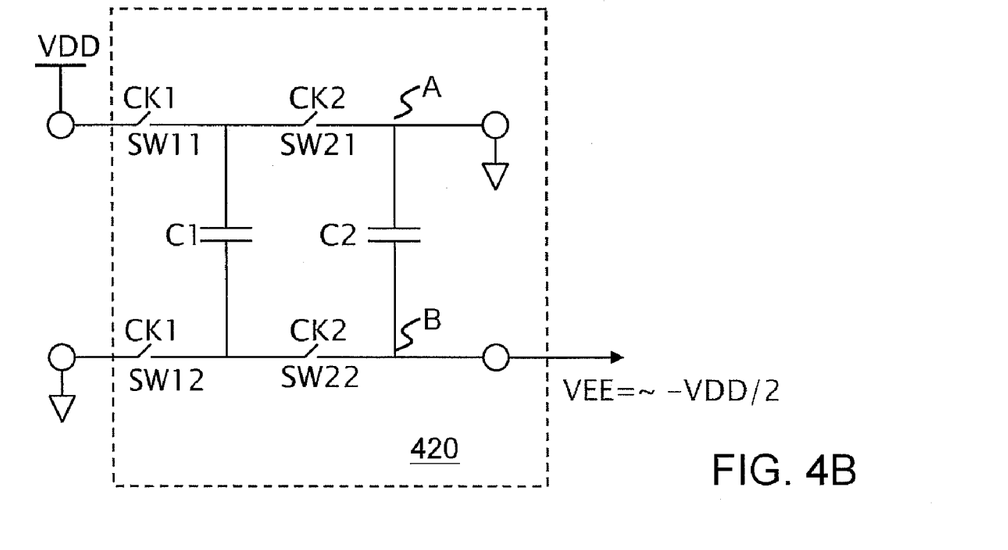
FIG. 4B is a circuit diagram showing the negative power generator of FIG. 4A.

FIG. 4A is a block diagram of a voltage generator 210 according to another embodiment of the present invention. Referring to FIG. 4A, a voltage generator 210 includes a positive power generator 410 and a negative power generator 420. The positive power generator 410 generates a positive voltage $V_{CC}$ (e.g., its voltage value equals to $V_{DD}/2$) while the negative power generator 420 generates a negative voltage $V_{EE}$ (e.g., its voltage value equals to $-V_{DD}/2$), in which the positive voltage $V_{CC}$ and the negative voltage $V_{EE}$ have opposite polarities, i.e., a mean value of the positive voltage $V_{CC}$ and the negative voltage $V_{EE}$ equal to 0V. In practice, absolute values of the positive voltage $V_{CC}$ and the negative voltage $V_{EE}$ are adjustable and may not be equal to $V_{DD}/2$. In one embodiment, the positive power generator 410 is a voltage regulator. In an alternative embodiment, the negative power generator 420 includes a charge pump. Referring now to FIG. 4B, a node A of the charge pump 420 is coupled to the ground voltage GND and the voltage difference between the node A and a node B is $V_{DD}/2$. The circuit configuration of the charge pump 420 is similar to that of the charge pump 220 of FIG. 3A and thus will not be described herein.

Figure 5A:
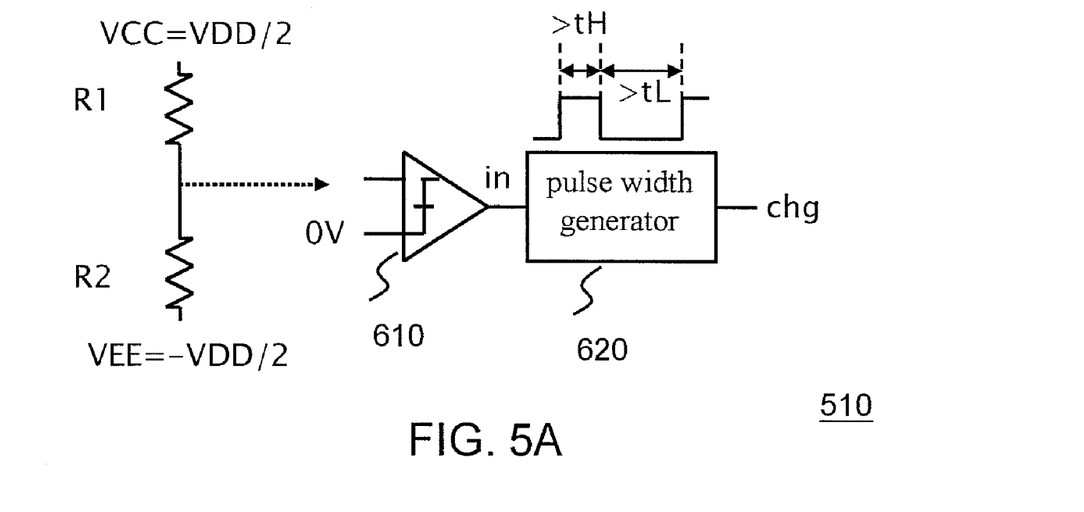
FIG. 5A is a block diagram showing a voltage detector 510 according to an embodiment of the present invention.

In an alternative embodiment, the negative power generator 420 further includes a voltage detector 510 and an oscillating signal generator 520. The voltage detector 510 detects the negative voltage $V_{EE}$ outputted from the charge pump 420 and then generates a control signal chg, whereas the oscillating signal generator 520 generates one or both of the signal CK1 and the signal CK2 according to the control signal chg. FIG. 5A is a block diagram showing the voltage detector 510 of the negative power generator 420 according to an embodiment of the present invention. Referring to FIG. 5A, the voltage detector 510 includes a comparator 610 and a pulse width generator 620. The comparator 610 compares an input signal (generated by a voltage divider having two resistors R1, R2 connected in series) related to the negative voltage $V_{EE}$ with a reference voltage (equal to 0V if two resistors R1, R2 have the same resistance value) and then generates a compared signal in; the pulse width generator 620 outputs the control signal chg according to the compared signal in.

Figure 5B:
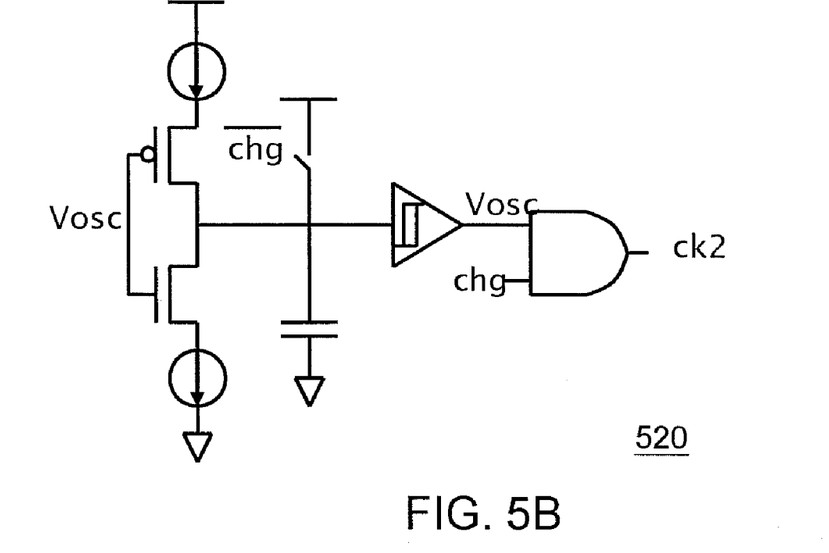
FIG. 5B is a circuit diagram showing an oscillating signal generator according to an embodiment of the present invention.
Figure 5C:
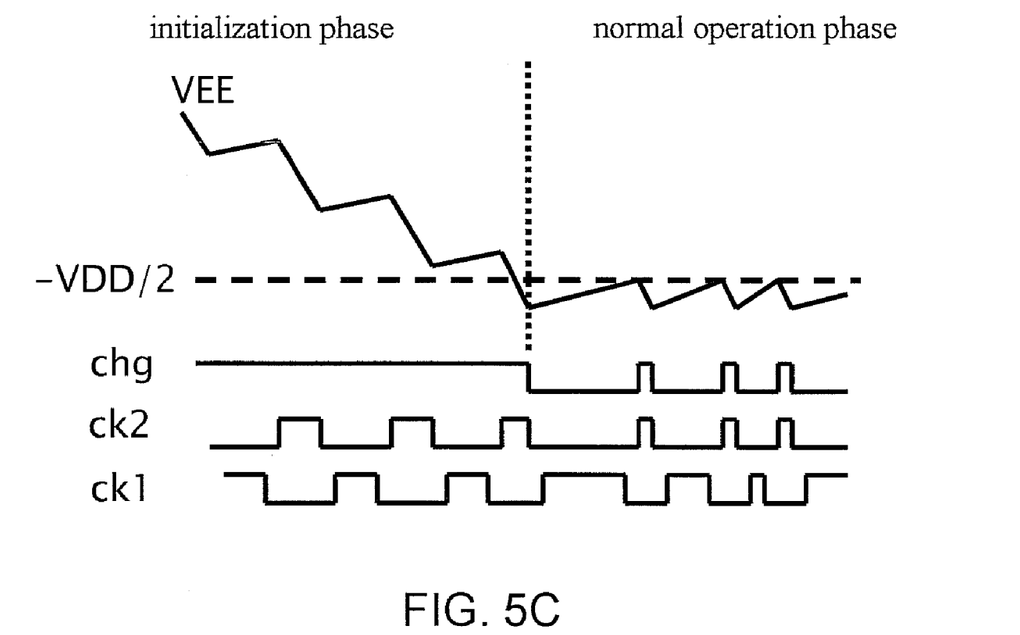
FIG. 5C is a waveform diagram showing the signals CK1, CK2 and the negative voltage $V_{EE}$.

FIG. 5B is a circuit diagram showing the oscillating signal generator 520 according to an embodiment of the present invention. Referring to FIG. 5B, the oscillating signal generator 520 includes two current sources, two transistors, a switch, a capacitor, a Schmitt trigger and an AND gate. The functions of all elements of the oscillating signal generator 520 are well known to those skilled in the art and therefore will not be described herein. FIG. 5C is a waveform diagram showing the signals CK1, CK2 and the negative voltage $V_{EE}$. Referring to FIG. 5C, while the negative voltage $V_{EE}$ exceeds $-V_{DD}/2$ (which is adjustable), the control signal chg is set to 1, and the control signal chg enters a normal operation phase until the negative voltage $V_{EE}$ meets $-V_{DD}/2$. In addition, the control signal chg is equivalent to the signal CK2 during the normal operation phase.

Figure 6A:
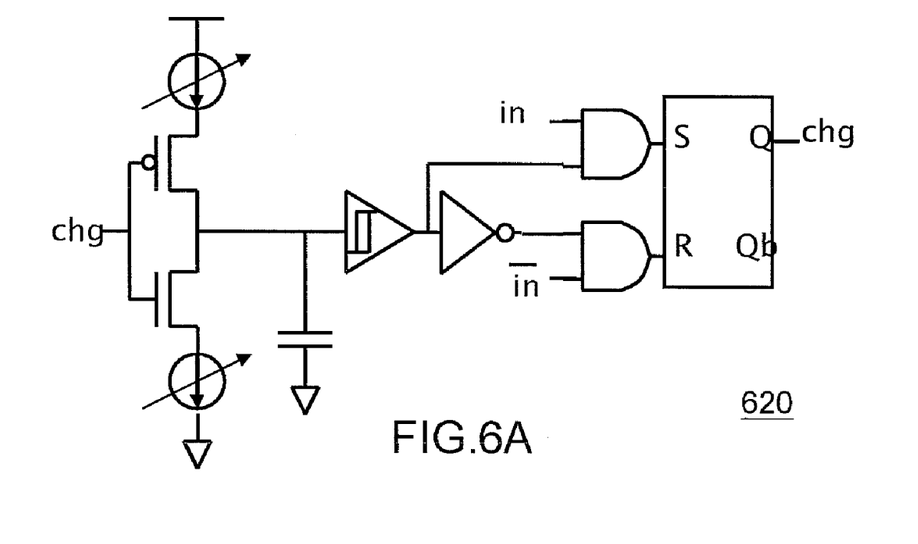
FIG. 6A is a circuit diagram showing the pulse width generator 620 according to an embodiment of the present invention.
Figure 6B:
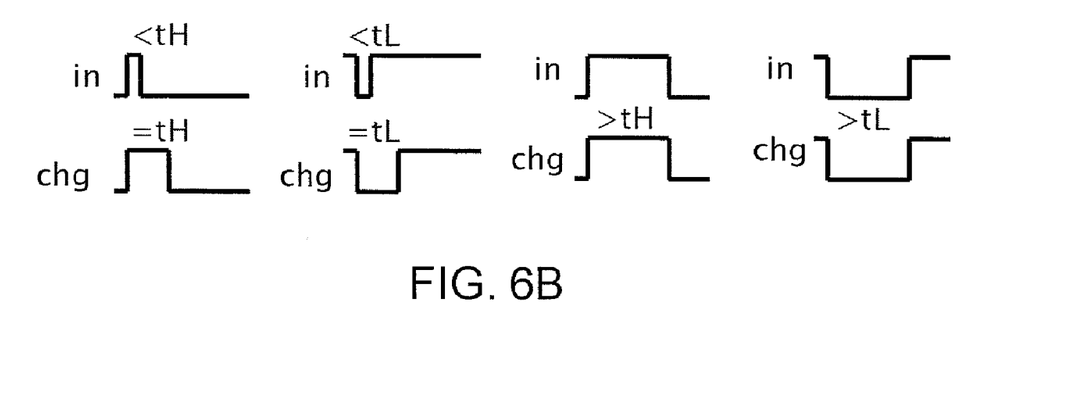
FIG. 6B is a waveform diagram showing relations between an input signal and an output signal of the pulse width generator 620.

FIG. 6A is a circuit diagram showing the pulse width generator 620 according to an embodiment of the present invention. FIG. 6B is a waveform diagram showing relations between an input signal in and an output signal chg of the pulse width generator 620. As observed from FIG. 6A, the pulse width generator 620 includes two current sources, two transistors, a capacitor, a Schmitt trigger, an NOT gate, two AND gates and a flip-flop. The functions of all elements in FIG. 6A are well known to those skilled in the art who can easily derive the waveforms of FIG. 6B, and therefore will not be described herein. In brief, there are minimum time limits for the output signal chg to be set to 1 and 0 by means of operations of the oscillating signal generator 520. That is, the output signal chg is maintained at 1 for at least a time period of $t_H$ if the output signal chg is equal to 1; the output signal chg is maintained at 0 for at least a time period of $t_L$ if the output signal chg is equal to 0, where the time period $t_H$ and the time period $t_L$ can be adjusted by means of the current of the current source of FIG. 6A.

The present invention is adapted to a general-purpose hand-held electronic device, which includes a pair of earphone driver amplifier circuits 200 to drive a left earphone and a right earphone respectively.

As previously described, on condition that the voltage that the elements in the driver amplifier circuit may sustain is not necessarily larger than $(2 \times V_{DD})$, the earphone driver amplifier circuits of the present invention can also generate audio signals containing no DC component or other specified voltage levels such that the output audio signals can be directly delivered to the next stage circuit without configuring the AC-coupling capacitor.

While certain exemplary embodiments have been described and shown in the accompanying drawings, it is to be understood that such embodiments are merely illustrative of and not restrictive on the broad invention, and that this present invention should not be limited to the specific construction and arrangement shown and described, since various other modifications may occur to those ordinarily skilled in the art.

What is claimed is:

1. A method for driving an output signal and reducing a DC bias of the output signal, comprising:
   receiving a first operating voltage having a magnitude with reference to ground;
   performing a level shifting of the first operating voltage to generate a second operating voltage, wherein the second operating voltage is defined by positive and negative values with reference to ground, wherein the total magnitude between the positive and negative values is less than twice that of the magnitude of the first operating voltage;
   providing the second operating voltage to an amplifier such that the amplifier is substantially biased at zero voltage; and
   driving an input signal by the amplifier to generate an output signal.

2. The method of claim 1, wherein the magnitude of each of the positive and negative values of the second operating voltage with reference to around is substantially equal to half that of the first operating voltage with reference to ground.

3. The method of claim 2, wherein the first operating voltage comprises a first voltage and a second voltage GND, and the second operating voltage comprises a third voltage and a fourth voltage.

4. The method of claim 1, wherein the generation of the second operating voltage comprises:
   generating the positive value of the second operating voltage; and
   generating the negative value of the second operating voltage;
   wherein a mean of the positive voltage and the negative voltage is substantially equal to zero.

5. The method of claim 4, wherein the negative value is generated by a charge pump.

6. A driver amplifier comprising:
   a voltage level shifting circuit comprising a plurality of switches and capacitors configured to receive a first operating voltage and output a second operating voltage, wherein the second operating voltage is defined by positive and negative values with reference to ground, wherein the total magnitude between the positive and negative values is less than twice that of the first operating voltage with reference to ground; and
   a driver circuit having first and second power leads which are coupled to the second operating voltage such that the driver circuit is substantially biased at zero voltage, the driver circuit receiving an input signal to drive an output signal, wherein the DC component of the output signal is substantially equal to zero.

7. The circuit of claim 6, wherein the magnitude of each of the positive and negative value of the second operating voltage with reference to ground is substantially equal to half that of the first operating voltage with reference to ground.

8. The circuit of claim 7, wherein the voltage level shifting circuit shifts the first operating voltage to output the second operating voltage.

9. The circuit of claim 6, wherein the magnitude of the first operating voltage is substantially equivalent to that of the second operating voltage.

10. The circuit of claim 9, wherein the first operating voltage comprises a first voltage and a second voltage GND, and the second operating voltage comprises a third voltage and a fourth voltage.

11. The circuit of claim 10, wherein the voltage level shifting circuit comprises:
    a pair of first switches, a pair of first terminals of the pair of first switches respectively receiving the first voltage and the second voltage GND;
    a pair of second switches, a pair of first terminals of the pair of second switches coupled with a pair of second terminals of the pair of first switches;
    a first capacitor, two terminals of the first capacitor respectively coupled to the pair of the second terminals of the pair of first switches; and
    a second capacitor, two terminals of the second capacitor are respectively coupled to the pair of the second terminals of the pair of second switches for outputting the third voltage and the fourth voltage.

12. The circuit of claim 9, wherein the voltage level shifting circuit comprises a charge pump.

13. The circuit of claim 6, wherein the voltage level shifting circuit comprises:
    a positive power generator for receiving the first operating voltage and outputting the positive value of the second operating voltage; and a negative power generator for receiving the first operating voltage and outputting the negative value of the second operating voltage;

wherein a mean of the positive value and the negative value is substantially equal to zero.

14. The circuit of claim 13, wherein the negative power generator comprises a charge pump.

15. The circuit of claim 14, wherein the negative power generator further comprises:

a voltage detector for detecting the negative voltage and outputting a control signal; and an oscillating signal generator for outputting an oscillating signal according to the control signal, wherein the oscillating signal is used to control operations of the charge pump.

16. The circuit of claim 15, wherein the voltage detector comprises:

a comparator for comparing a comparing voltage with a reference voltage to generate a compared signal, wherein the comparing voltage corresponds to the negative voltage; and a pulse width generator for outputting the control signal according to the compared signal.

17. The circuit of claim 6, wherein the voltage generator comprises a charge pump.

18. The circuit of claim 17, wherein the charge pump comprises a pair of first switches, a pair of second switches, a first capacitor, and a second capacitor.

19. The circuit of claim 18, wherein the first and the second capacitors have capacitances within the range of several microfarads ($\mu F$) and switching frequencies of the first switches and the second switches are in the range of several hundreds of KHz.

20. The circuit of claim 6, wherein the driver circuit comprises at least one element configured to withstand a maximum voltage of less than twice the magnitude of the first operating voltage with reference to ground.

* * * * *